(12) United States Patent
Goncalves Neto et al.

(10) Patent No.: US 7,381,452 B2
(45) Date of Patent: Jun. 3, 2008

(54) AMORPHOUS HYDROGENATED CARBON FILM

(76) Inventors: Luiz Goncalves Neto, Rua Benedito da Silva, n° 896, São Carlos, SP (BR) 13560-090; Ronaldo D. Mansano, Rua Jamil Hajaj, n° 123, São Paulo, SP (BR) 04164-020; Giuseppe A. Cirino, Rua Aida Lang Bartolato, n° 57, São Paulo, SP (BR) 05325-060; Luiz S. Zambom, Rua José Aives Cunha Lima, São Paulo, SP (BR) 05360-050; Patrick B. Verdonck, Av. Dr. Cândido Mota Filho, n°521 - ap. 22, Ed. Santa Clara, São Carlos, SP (BR) 05351-000

( * ) Notice: Subject to any disclaimer, the term of this patent is extended or adjusted under 35 U.S.C. 154(b) by 70 days.

(21) Appl. No.: 10/487,031

(22) PCT Filed: May 8, 2002

(86) PCT No.: PCT/BR02/00067

§ 371 (c)(1),
(2), (4) Date: Feb. 17, 2004

(87) PCT Pub. No.: WO03/027350

PCT Pub. Date: Apr. 3, 2003

(65) Prior Publication Data

US 2004/0219304 A1 Nov. 4, 2004

(30) Foreign Application Priority Data

Sep. 26, 2001 (BR) .................................. 0105474

(51) Int. Cl.
*C23C 16/26* (2006.01)
(52) U.S. Cl. .................................. 427/577; 427/249.1
(58) Field of Classification Search ................. 427/577
See application file for complete search history.

(56) References Cited

U.S. PATENT DOCUMENTS 5,074,983 A 12/1991 Eltoukhy et al.
5,616,179 A * 4/1997 Baldwin et al. ............ 117/108

FOREIGN PATENT DOCUMENTS

JP 05-208806 8/1993
WO PCT/BR02/00067 12/2002

OTHER PUBLICATIONS

Alan H. Lettington, Applications Of Diamond-Like Carbon Thin Films, Carbon vol. 36, No. 5-6. pp. 555-560, 1998. [Great Britain].
Klaus Pöhlmann et al., Effect Of Thermal Oxidation On Indentation And Scratching Of Single-Crystal Silicon Carbide On Microscale, Wear.
237 (2000) 116-128, Lausanne, Switzerland.

* cited by examiner

*Primary Examiner*—Monique R. Jackson
(74) *Attorney, Agent, or Firm*—John A. Merecki; Hoffman, Warnick & D'Alessandro

(57) ABSTRACT

The present invention concerns an improved process for the deposition of amorphous hydrogenated carbon film, more specifically an improved low temperature, low power and low vacuum cathodic sputtering process. The invention also concerns the film produced by said process and articles containing an amorphous hydrogenated carbon film coating.

15 Claims, No Drawings

AMORPHOUS HYDROGENATED CARBON FILM

DISCLOSURE OF THE INVENTION

The present invention refers to an improved process for the deposition of amorphous hydrogenated carbon films, more specifically to an improved low temperature, low power and low vacuum process. The invention also concerns the film produced by said process and articles containing an amorphous hydrogenated carbon film coating.

DESCRIPTION OF THE STATE OF THE ART

Amorphous hydrogenated carbon films, also known as DLC ("diamond-like carbon"), a-C:H or also a:C—H, are well known in the literature. They are films comprised of small crystals whose local atomic configuration may comprise tetrahedron-shaped carbon-carbon bonds of the $sp^3$ type and/or planar bonds of the $sp^2$ type, however the crystal size is so small that X-ray diffraction analysis reveals to be an amorphous material. The ratio between hybridations $sp_3:sp^2$ is a critical factor in the quality of the hydrogenated amorphous carbon films.

It is known that DLC films show a wide range of qualities (for example, high hardness; low friction coefficient, high chemical inertness; good optical transmittance, high thermal conductivity, low dielectric constant, among others), useful for applications in areas such as mechanics, chemistry, physics, electronics, optics, etc. A representative reference of this knowledge in the literature is the article "Applications of Diamond-Like Carbon Thin Films" by Allan H. Lettington (Carbon Vol. 36, No. 5-6, pp. 555-560, 1998, Pergamon Press).

Processes for producing DLC films are also known in the state of the art, for example:

- chemical vapor deposition, also known as CVD, alternatively assisted by DC or radio frequency plasmas, also known as PECVD;
- cathodic sputtering, where an electrical discharge in a gaseous plasma system generates ions which can remove atoms from a target or react by forming a hydrogenated carbon layer which is also removed from the target, the removed atoms are then deposited on a substrate; alternatively, in the presence of a gas that chemically reacts with such atoms, called in this case reactive cathodic sputtering;
- ion beam deposition;
- electron beam deposition;
- laser ablation.

The present invention concerns the reactive cathodic sputtering technology, with respect to the claimed process.

BRIEF DESCRIPTION OF THE INVENTION

The presently known processes for producing DLC films have limitations that have negative influence on its use on a large scale. Generally, the processes require:

- high quality vacuum, typically about $10^{-6}$ Torr;
- high power, typically varying between 40-200 watt per $cm^2$ at the electrode;
- use of high temperatures, typically above 200° C.

The use of high vacuum and high power or high temperature requires high performance equipment suited to such conditions, besides high purity components, thus making the process expensive and subject to severe controls. However, in spite of all these restrictive aspects, the deposition of a DLC film is effective only on small surface areas, normally planar, seldom larger than 100 $cm^2$. It should also be remarked that the high temperature inhibits the DLC film deposition processes onto substrates that present low resistance to high temperatures, for example, common organic polymers in the optics field.

The present invention provides an improvement with respect to the problems detected in the prior art, by means of an improved reactive cathodic sputtering process for the deposition of amorphous carbon hydrogenated films upon large areas, using temperature, vacuum and power requirements lower than those presently known.

One of the advantages of the present invention is that it is consistent with already existing industrial cathodic sputtering processes, since the conditions used do not require additional equipment or conditions incompatible with the equipment presently used.

DETAILED DESCRIPTION OF THE INVENTION

As used herein, for the sake of an easy understanding, the word "substrate" indistinctly refers to articles, devices or products, as well as their pieces or parts, including their surfaces.

More specifically, the invention relates to a process for the deposition of amorphous hydrogenated carbon film characterized by comprising the following steps:

- promoting contact between (a) a first electrode and (b) a substrate on the surface of which said film will be deposited;
- providing vacuum in an environment containing said first electrode and a second carbonaceous electrode, already in the presence of, or subsequently providing said environment with, at least one amorphous hydrogenated carbon film precursor;
- providing, for a sufficient time, a DC and/or radio frequency discharge between said first electrode and said second carbonaceous electrode, equal to or higher than about 0.01 watt per square centimeter of surface of the carbonaceous electrode;
- said vacuum being sufficient to provide plasma generation between said first and second electrodes.

Without limiting the scope of the invention, it is believed that the phenomenon that takes place during the process of the invention is, in view of the plasma generated, the generation of ions that reach the electrode of carbonaceous material, promoting the removal or sputtering of atoms, molecules or even larger fragments to the space between the electrodes, which then collide with atoms/molecules of the film precursor, generating $CH_3$ radicals, which are then deposited as a film on the surface of the substrate in contact with the first electrode.

As employed herein, an amorphous carbon hydrogenated film precursor is any solid, liquid or gaseous matter having C—H bonds in its structure, and/or it is capable of generating $CH_3$ radicals under the conditions of the invention, either alone or in combination with other precursors. Suitable examples of amorphous hydrogenated carbon film precursors are hydrocarbons, acetones, alcohols and freons. Particularly one uses one or more of the components of the group comprising methane, acetylene, fluoromethane and trifluoromethane, the precursor more particularly used being methane alone. The process of the invention does not exclude the joint use of the precursor or precursors of carbon films with one or more additives known and used in the formation of a DLC film by cathodic sputtering processes, for example, nitrogen, fluorine or boron to enhance the electric/electronic qualities of the obtained film, argon to enhance the mechanical properties, oxygen to increase the hardness and the chemical inertness of the films, silicon to increase the chemical inertness, and so on.

As employed herein, carbonaceous electrode refers to any electrode composed mainly of carbon which has in its structure carbon bonds and/or hydrocarbons (C—H) and/or carbon-silicon or carbon-nitrogen compounds, being suitable highly pure graphite, particularly with purity above 99.0%, for example, 99.9%. As is known by one skilled in the art, the purity of the carbonaceous electrode affects the qualities of the obtained amorphous hydrogenated carbon film. For example, for electrical application a higher purity carbon is more suitable than the one necessary for optical applications. A carbonaceous electrode, as used herein, can be a substrate made of carbonaceous material itself or another material, for example, metal such as copper, plastic or polymer, but covered with or in contact with a substrate of carbonaceous material.

The power values suitable to the invention are higher than about 0.01 watt/cm$^2$ (watt per square centimeter) of surface of the carbonaceous electrode, more particularly between about 0.1 watt/cm$^2$ and 1 watt/cm$^2$. As known to one skilled in the art, the larger the carbonaceous electrode and/or the part on which the amorphous hydrogenated carbon film will be deposited and/or the distance between the electrodes, the greater the power suitable to the efficient formation of such a film. Distances between electrodes shorter than about 40 mm favor a less homogeneous deposition of the carbon film due to the electromagnetic field intrinsically present in the cathodic sputtering technique. Particularly, the distance between electrodes in the plasma system of the invention varies between about 40 mm and 100 mm.

The vacuum suitable to the formation of plasma under the conditions of the present invention corresponds to a pressure equal to or less than about $1 \times 10^{-1}$ Torr, more particularly pressures between about $1 \times 10^{-4}$ and $1 \times 10^{-1}$ Torr.

The temperature used in the process of the invention is one of the parameters that affect the quality of the carbon film formed, but it is not determinant to the effective accomplishment thereof. Particularly, the process of the invention is carried out between about −20° C. and 200° C., or still more particularly, between room temperature and about 100° C. However, even temperatures below −20° C. or above 200° C. can be employed, by adjusting conveniently the deposition equipment, as can be determined by a person skilled in the art.

Also as known to one skilled in the art, the temperature may not be steady during the deposition process of amorphous hydrogenated carbon film and can be varied if desired. Even if the process of the invention employs very low temperatures when compared to the prior art, one does not exclude the use of cooling devices for both the carbonaceous electrode and the first electrode in contact with the substrate upon which the carbon film will be deposited, what allows the process to be used for the deposition of DLC films upon a wide range of materials.

One of the great advantages of the process of the invention is the deposition of amorphous hydrogenated carbon film upon large surface areas, in a way never disclosed before, in spite of the less severe temperature, power and vacuum conditions than those found in the prior art. There is no limitation to the extension of the area to be deposited with carbon film, and particularly the process of the invention allows the deposition upon areas between 1 square centimeter and 20 square meters, provided that the dimensions and the operational characteristics of the equipment allow so.

In a particular embodiment of the invention, the deposition of the amorphous hydrogenated carbon film can be accomplished upon whole objects in a single operation, and not one surface at a time. This is possible by configuring the shape of the electrode of carbonaceous material to follow the topography of the external surfaces (and/or internal surface, if any) of the article to be coated with carbon film, which article is in contact with the first electrode, in such a way that the distance between the surfaces of the article and the surfaces of the carbonaceous electrode is substantially constant throughout the whole extension of the article. For example, for an article with a planar surface followed by a curved surface, for which a film of homogeneous thickness is required, a corresponding carbonaceous electrode provided with a planar surface followed by a curved surface of a concavity opposite the one of the article is used, in such a way that any point on the surface of the article, straight or curved, will be at the same selected and constant distance from the carbonaceous electrode. The feature of the process of the invention of using a carbonaceous electrode, typically a graphite electrode, configures a cheap process for the deposition of carbon film upon three-dimensional objects, for it is an easily conformable material compared to other processes of the prior art (by machining, sintering, extrusion or any other suitable conformation process).

The thickness of the amorphous hydrogenated carbon films produced by the process of the invention, is also a function of time. For example, very thin coalesced films from about 10 nanometers to films considered thick in the order of 8 µm can be obtained. The invention allows the thickness of an amorphous hydrogenated carbon film to vary along its extension.

The present invention comprises the process for the deposition of amorphous hydrogenated carbon films on fibers of any nature, for example, optical fibers, textile fibers, high performance fibers such as aramide, or any other. The process of the invention also is applied for the deposition of DLC films upon woven and non-woven articles, for example, paper.

Specifically in the optics field, the invention advantageously allows the provision not only of varied substrates coated with amorphous hydrogenated carbon film, for example, polycarbonate or other organic polymers (considered until now of low durability in view of the degradation of the polymer at high temperatures and the difficult adhesion of the film on its surface), but also optical substrates themselves, where the film itself can be structural, performing the function of an optical element, for example, lens, prism, etc.

As already mentioned previously, the process of the invention is consistent with equipment and resources currently available for reactive cathodic sputtering processes. Thus, standard procedures can perfectly be used in conjunction with the invention. For example, to deposit the DLC film of the invention on a lens, it is necessary to clean the lens beforehand—such cleansing is performed normally, either chemically (for example, by using an organic solvent such as isopropanol, acetone, or cleansing same by using acids and bases normally used in microelectronics) or physically (for example, argon plasma sputtering, without graphite electrode), to finally carry out the film depositing procedure of the invention.

There is no limitation as to the type of material upon which the amorphous carbon hydrogenated film can be deposited according to the process of the invention, the following being cited as mere examples thereof: glass, silicon, silicon nitride, steel, iron, non-ferrous metals, thermoset and thermoplastic polymers, elastomers, wood, crystals, minerals, organic materials, etc. The corresponding applications also vary widely, among which we can cite, without any limitation: filtering of ultraviolet, infra-red, or other specific wave length radiations; layer of pre-deposition on a substrate (for example, steel) to improve the adhesion to another substrate (for example, plastic); higher resistance to abrasion for optical elements, protection coating for polymer-based optical microdevices manufacturing, such as phase diffraction gratings, holograms, active optical material on diffractive optical elements, coating of prosthesis and surgical instruments in general aiming at both low friction between the component parts and bio-compatibility, especially the hemo-compatibility, mechanical or electronic components subject to chemically and mechanically aggressive environments; ionic membranes and electrodes used in unidirectional electrochemical processes of the fuel cell type, wood coating to prevent the penetration of water, reduction of friction between mechanical components, etc.

In another alternative, the invention is related to amorphous hydrogenated carbon films deposited according to the process of the invention.

Still in another alternative embodiment, the invention is related to articles, products, substrates, objects and surfaces coated with the amorphous hydrogenated carbon film deposited according to the process of the invention.

EXAMPLE

An example of the present invention is given below, being well understood that it is only a particular embodiment among the several possible alternatives readily noticed by one skilled in the art from the information provided herein. Said example does not limit the scope of the invention, the extension of which is determined by the claims attached to this specification.

Deposition of a DLC Film Upon a Polycarbonate Surface

An amorphous hydrogenated carbon film having an approximate area of 134 $cm^2$ is deposited on the surface of a polycarbonate lens for automobile headlights, according to the following steps:

cleaning by immersion in isopropyl alcohol for 15 minutes, followed by nitrogen jet drying;
placing the clean lens in a deposition chamber, such that it is in contact with the first electrode;
applying a vacuum of down to $8\times10^{-4}$ Torr to the deposition chamber;
injecting 99.8% pure methane until a $5\times10^{-3}$ Torr pressure is attained;
generating the plasma with a 13.56 MHz 150 W radio frequency generator;
depositing for 30 minutes, thus obtaining a thickness of about 1 µm of hydrogenated amorphous carbon;
applying a vacuum of down to $8\times10^{-6}$ Torr to the deposition chamber;
venting the system with 99.6% pure nitrogen until the atmospheric pressure is attained;
removing the sample from the reactor.

An increase in the resistance to abrasion of the coated polycarbonate in relation to the non-coated polycarbonate is revealed. Once the samples are subjected to the scratch test, in accordance with Pohlmann, K.; Bhushan, B.; Karl-Heinz, G. Z.; "Effect of thermal oxidation on indentation and scratching of single crystal silicone carbide on micro scale" published in Wear n° 237 pp. 116-128, 2000) one verifies a reduction in the penetration of a diamond needle from 40 µm in the common polycarbonate to 16 µm in the coated polycarbonate according to the invention.

The invention claimed is:

1. A process for the deposition of amorphous hydrogenated carbon film comprising the steps of:
    promoting contact between a first electrode and a substrate on the surface of which said film will be deposited;
    providing vacuum corresponding to a maximum pressure of about $1\times10^{-1}$ Torr, in an environment containing said first electrode and a second carbonaceous electrode,
    providing a temperature to the first electrode ranging from about −20° C. to about 200° C.;
    providing a chemically active film precursor;
    providing a DC and/or radio discharge frequency ranging from about 0.01 watt/$cm^2$ to about 1 watt/$cm^2$ of surface of said second carbonaceous electrode between said first electrode and said second carbonaceous electrode,
    wherein said vacuum is sufficient to provide plasma generation between said first and second electrodes, and
    wherein the carbonaceous electrode is provided with a conformation of the article to be coated with the amorphous hydrogenated carbon film, the conformation being selected from a group consisting of: fully following the topography of an internal surface, partially following the topography of the internal surface, fully following the topography of an external surface, partially following the topography of the external surface, fully following the topography of the internal surface and fully following the topography of the external surface, fully following the topography of the internal surface and partially following the topography of the external surface, partially following the topography of the internal surface and fully following the topography of the external surface; and partially following the topography of the internal surface and partially following the topography of the external surface.

2. The process according to claim 1, wherein said chemically active film precursor is a substance that has C—H bonds in its structure and/or is capable of generating $CH_3$ radicals under the conditions of said process, either alone or in combination with other precursors.

3. The process according to claim 1, wherein said chemically active film precursor is selected from a group consisting of: hydrocarbons, acetones, alcohols, freons and combinations thereof.

4. The process according to claim 1, wherein said chemically active film precursor is selected from a group consisting of: methane, acetylene, fluoromethane and trifluoromethane.

5. The process according to claim 1, wherein said chemically active film precursor is methane.

6. The process according to claim 1, further comprising providing at least one additional additive to said chemically active film precursor.

7. The process according to claim 6, wherein said additive is selected from a group consisting of: nitrogen, fluorine, boron, argon, oxygen, silicon and combinations thereof.

8. The process according to claim 1, wherein said second carbonaceous electrode is an electrode composed mainly of carbon and has a structure selected from a group consisting of: only carbon bonds, hydrocarbons, carbon-silicon compounds, carbon-nitrogen compounds, and combinations thereof.

9. The process according to claim 8, wherein said second carbonaceous electrode has a purity of at least 99.5%.

10. The process according to claim 1, wherein said DC and/or radio frequency power level between said first electrode and said second carbonaceous electrode ranges from about 0.1 watt/cm$^2$ to about 1 watt/cm$^2$.

11. The process according to claim 1, wherein the distance between said first electrode and said second carbonaceous electrode ranges from about 40 mm to about 100 mm.

12. The process according to claim 1, wherein said vacuum corresponds to a pressure ranging from about $1 \times 10^{-4}$ Torr to about $1 \times 10^{-1}$ Torr.

13. The process according to claim 1, wherein the temperature of the first electrode ranges from about 10° C. to about 100° C.

14. The process according to claim 1, wherein at least one of the said first electrode and said second electrode is refrigerated.

15. The process according to claim 1, wherein said second carbonaceous electrode is constructed by a process selected from: machining, sintering and extrusion.

* * * * *